United States Patent [19]
Tang et al.

[11] Patent Number: 5,481,494
[45] Date of Patent: Jan. 2, 1996

[54] METHOD FOR TIGHTENING VT DISTRIBUTION OF 5 VOLT-ONLY FLASH EEPROMS

[75] Inventors: Yuan Tang, San Jose; Lee E. Cleveland, Santa Clara, both of Calif.

[73] Assignee: Advanced Micro Devices, Inc., Sunnyvale, Calif.

[21] Appl. No.: 362,346

[22] Filed: Dec. 22, 1994

[51] Int. Cl.$^6$ .................................................. G11C 11/34
[52] U.S. Cl. ................................. 365/185.24; 365/218
[58] Field of Search ................................. 365/185, 218, 365/900, 184

[56] References Cited

U.S. PATENT DOCUMENTS 5,231,602  7/1993  Radjy ........................ 365/185

*Primary Examiner*—A. Zarabian
*Attorney, Agent, or Firm*—Davis Chin

[57] ABSTRACT

There is provided an improved method for tightening the distribution of control gate threshold voltages of erase cells in flash EEPROM devices. A relatively low positive voltage is applied to the source regions of the EEPROM devices during an entire erase cycle. The magnitude of a negative constant voltage applied to control gates of the EEPROM devices is lowered to a predetermined voltage level during the entire erase cycle so as to obtain a tighter threshold voltage distribution. The value of a load resistor coupled between the low positive voltage and source regions is reduced simultaneously to a predetermined value so as to compensate for the increased erase time caused by the lowering of the magnitude of the negative constant voltage. As a result, an improved threshold voltage $V_T$ distribution after erase is obtained without sacrificing any reduction in the erase speed.

6 Claims, 3 Drawing Sheets

METHOD FOR TIGHTENING VT DISTRIBUTION OF 5 VOLT-ONLY FLASH EEPROMS

BACKGROUND OF THE INVENTION

This invention relates generally to floating gate memory devices such as an array of flash electrically erasable and programmable read-only memory devices (EEPROMs). More particularly, the present invention relates to a new and improved method for tightening the distribution of control gate threshold voltages of erased cells in 5 Volt-Only flash EEPROMs.

As is generally known in the art, there exists a class of non-volatile memory devices referred to as "flash EEPROMs" which has recently emerged as an important memory device by combining the advantages of EPROM density with EEPROM electrical erasability. Such flash EEPROMs provide electrical erasing in a small cell size. FIG. 1 illustrates a prior art cross-sectional view of a flash EEPROM cell 10. The EEPROM cell is formed of a substrate 12, typically of a p-type conductivity having embedded therein an $n^+$ drain region 14 and an n-type double-diffused source region 16. The double-diffused source region 16 is formed of a deeply diffused but lightly doped n-junction 18 and a more heavily doped but shallower $n^+$ junction 20 embedded within the deep n-junction 18. The deeply diffused n-junction 18 is typically formed by using a phosphorus implant, and the shallower $n^+$ junction 20 is typically formed by using an arsenic implant after the phosphorus implant.

A relatively thin gate dielectric layer 22 (i.e., oxide having a uniform thickness of about 100 Å) is interposed between the top surface of the substrate 12 and a conductive polysilicon floating gate 24. A polysilicon control gate 26 is insulatively supported above the floating gate 24 by an interpoly dielectric 28. A channel region 30 in the substrate 12 separates the drain region 14 and the source region 16. Further, there are provided terminal pins 15, 17, and 19 for applying a source voltage $V_S$ to the source region 16, a gate voltage $V_G$ to the control gate 26, and a drain voltage $V_D$ to the drain region 14 respectively.

According to conventional operation, a flash EEPROM cell of FIG. 1 is "programmed" by applying a relatively high voltage $V_G$ (approximately +9 volts) to the control gate 26 via the terminal pin 17 and a moderately high voltage $V_D$ (approximately +5 volts) to the drain region 16 via the terminal pin 19 in order to produce "hot" (high energy) electrons into the channel 30 near the drain region 14. The source region 16 is connected to a ground potential ($V_S$= 0) via the terminal pin 15. The hot electrons are generated and accelerated across the gate oxide layer 22 into the floating gate 24, thereby making a threshold voltage of the transistor cell 10 high. This hot electron injection results in an increase of the floating gate threshold by approximately three to five volts. On the other hand, the flash EEPROM cell of FIG. 1 is "erased" by applying a positive voltage $V_S$ to the source region 16 via the terminal 15 while the control gate 26 via the terminal pin 17 is either grounded ($V_G$= 0) or biased to a negative voltage dependent upon the value of the positive voltage $V_S$. In a "5 Volt-Only flash EEPROM" device, the conventional erase bias condition of $V_S$= +5 V and $V_G$= −10.68 V is used. The trapped electrons are extracted from the floating gate 24 through the gate oxide layer 22 to the source region 16 by way of Fowler-Nordheim (F-N) tunneling, thereby making the threshold voltage of the transistor cell 10 low.

It is also generally known in the art that the threshold voltage of the single-transistor flash EEPROM cell after erase is variable. A large variation or wide distribution of the threshold voltage $V_T$ after erasure is one of the most considered problems in performances possessed by the EEPROM devices. The distribution of the threshold voltages $V_T$ among the individual cells in the EEPROM array having floating-gate memory cells arranged in rows and columns is caused by processing variations, including localized variations in the tunnel oxide thickness, the areas of tunneling region, and the capacitive coupling ratios between the control gates and the floating gates as well as variations in the strengths of the erasing pulses.

If there exists cells with erased threshold voltages $V_T$ on a given column (bit line) less than zero, or if the floating gates are be positively charged, these cells will be conductive even though their control gates are being grounded. As a result, there will be caused column leakage so as to prevent the proper reading of any other cell in the column of the array containing this cell as well as making programming of the other cells on the same column increasingly more difficult. Under this condition, there is brought about a disadvantage that the data programming characteristic of the memory cell is deteriorated so as to cause endurance failures. Consequently, the number of times that the memory cell may be re-programmed is significantly reduced.

Therefore, the problem of wide distribution of the threshold voltages after erasure for such conventional EEPROM devices is of a major concern since it causes column leakage rendering the cells more difficult to program, thereby significantly limiting the endurance of the cells. As used herein, the term "endurance" refers to the number of times the memory cells in the array may be re-programmed and erased. Consequently, large variations of the threshold voltages after erasure due to over-erasure can greatly reduce the endurance of the memory cells to be less than 100,000.

The inventor has now discovered a new and improved method for tightening the distribution of control gate threshold voltages of erased cells in the 5 Volt-Only flash EEPROMs. This is accomplished by lowering the magnitude of the constant bias voltage applied to the control gate during erasure and reducing simultaneously the value of the load resistor coupled between the positive source voltage $V_S$ and the source region.

SUMMARY OF THE INVENTION

Accordingly, it is a general object of the present invention to provide a new and improved method for tightening the distribution of control gate threshold voltages of erased cells in 5 Volt-Only flash EEPROMs which has been traditionally unavailable.

It is an object of the present invention to provide an improved method for tightening the threshold voltage $V_T$ distribution of flash EEPROM devices which produces less column leakage, thus rendering high product yield and reliability.

It is another object of the present invention to provide an improved method for tightening the threshold voltage $V_T$ distribution of flash EEPROM devices which is realized by lowering the magnitude of the constant bias voltage applied to the control gate during erasure and reducing simultaneously the value of the load resistor coupled between the positive source voltage $V_S$ and the source region.

In a preferred embodiment of the present invention, there is provided a method for tightening the distribution of control gate threshold voltages of erased cells of flash EEPROM devices. This is accomplished by applying a relatively low positive voltage to source regions of the EEPROM devices during an entire erase cycle. The magnitude of a negative constant voltage applied to control gates of the EEPROM devices is lowered to a predetermined voltage level during the entire erase cycle so as to obtain a tighter threshold voltage distribution. Simultaneously, the value of a load resistor coupled between the low positive voltage and the source region is reduced to a predetermined value so as to compensate for the increased erase time caused by the lowering of the magnitude of the negative constant voltage. As a result, an improved threshold voltage $V_T$ distribution after erase is obtained without sacrificing a reduction in the erase speed.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
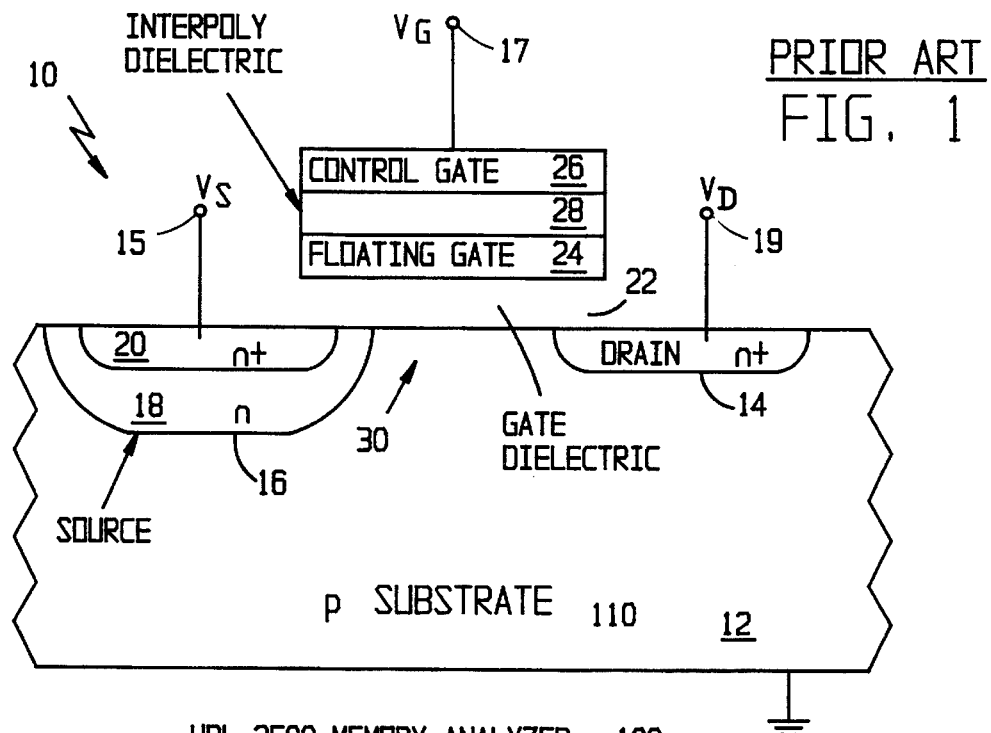
FIG. 1 shows a cross-sectional view of a conventional flash EEPROM cell having a floating gate and has been labeled "Prior Art"
Figure 2:
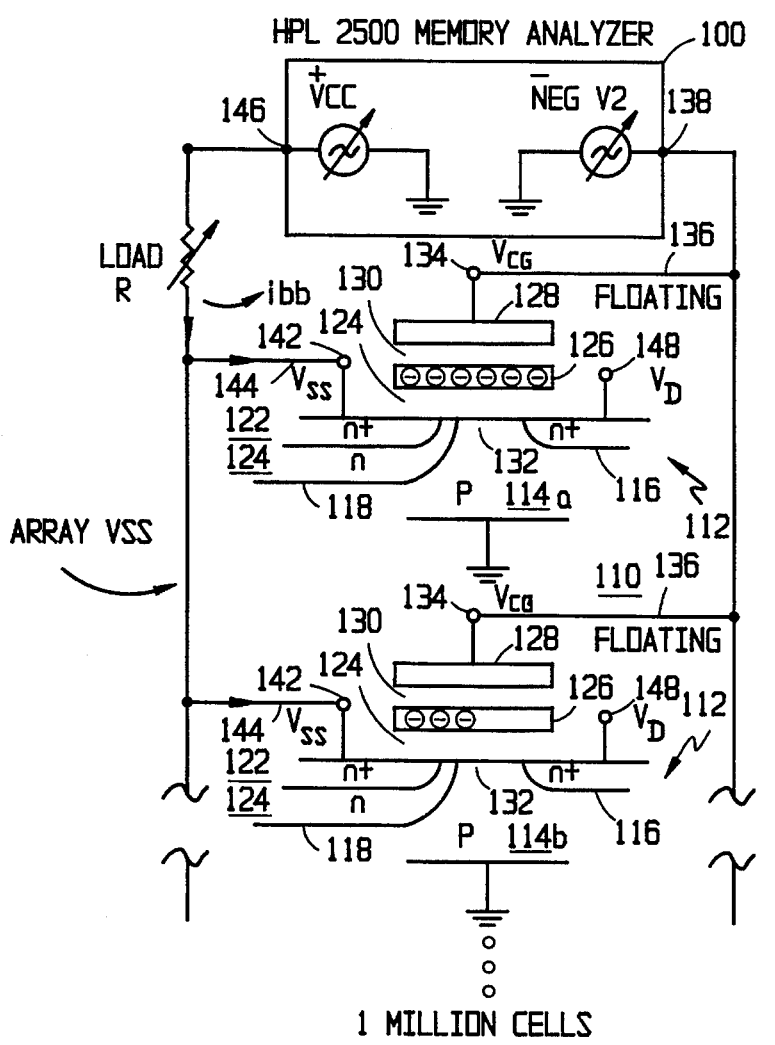
FIG. 2 illustrates a test set-up for the method for tightening the distribution of threshold voltages of erased cells, according to the present invention.

Referring now in detail to the drawings, there is illustrated in FIG. 2 a test set-up for the method for tightening the distribution of control gate threshold voltages of erased cells in a 5 Volt-Only flash EEPROM array 110, according to the present invention. The flash EEPROM array 110 is formed of a plurality of flash EEPROM cells 112 on a single integrated circuit chip arranged in an N×N matrix. It is to be understood that each of the memory cells 112 represents one of a large number, N×N (i.e., 1,048,576) of cells provided on the memory chip. For the sake of simplicity, only a portion of one column of the memory cells 112 in the N×N matrix has been shown.

As can be seen in FIG. 2, there is shown a cross-sectional view of the flash EEPROM (electrically erasable and programmable read-only memory) cells 112. Each of the EEPROM cells is formed of a substrate 114, typically of a p-type conductivity having embedded therein an $n^+$ drain region 116 and an n-type double-diffused source region 118.

The double-diffused source region 118 is formed of a deeply diffused but lightly doped n-junction 120 (phosphorus doped) and a more heavily doped but shallower $n^+$ junction 122 (arsenic doped) embedded within the deep n-junction 120. A relatively thin gate dielectric 124 (i.e., oxide of approximately 100 Å thickness) is interposed between the top surface of the substrate 114 and a conductive polysilicon floating gate 126. A polysilicon control gate 128 is insulatively supported above the floating gate 126 by an interpoly dielectric layer 130. A channel region 132 in the substrate 114 separates the drain region 116 and the source region 118.

Further, there is provided a terminal pin 142 for applying a source voltage $V_S$ to the source region a terminal pin 134 is provided for applying a gate voltage $V_G$ to the control gate 128. Finally, the terminal pin 148 is provided for applying drain voltage $V_D$ to the drain region 116.

Before describing in detail the new and improved method for tightening the distribution of control-gate threshold voltages of erased cells in the 5 Volt-Only flash EEPROM array 110 of FIG. 2, it is believed that it would be helpful in understanding the principles of the present invention and to serve as a background by first explaining the experimentation performed and the results of the investigation observed by the inventor.

Initially, it should be noted that in the 5 Volt-Only flash EEPROM device the voltage ΔV across the tunneling oxide (gate dielectric 124 in FIG. 2) is determined by the following equation:

$$\Delta V = (1 - \alpha_s) V_{ss} + \alpha_G |V_{CG}| + \frac{|Q|}{C_{TOTAL}}, \quad Q = -qXN_e < 0$$

where:

$\alpha_S$=source coupling $\alpha_G$=gate coupling q=1.602×10⁻¹⁹ Coulomb $N_e$=number of electrons on floating gate 126

$C_{TOTAL}$=total capacitance of device

The tunneling oxide (electrical) field is defined by ΔV/100 Å. From the above equation, it can be seen that for fixed applied source voltage $V_{SS}$ and control gate voltage $V_{CG}$ the tunneling field during erase will be controlled by the value of Q. Therefore, the more electrons on the floating gate, the higher will be the tunneling field.

During the erase condition, each memory cell 114 in the array 112 has the same source voltage $V_{SS}$ and control gate voltage $V_{CG}$ on the respective sources and control gates. However, due to processing variations the memory cell will erase at different speeds. For instance, assume at time $t_0$ that the memory cell 114a has 10,000 electrons left on its floating gate and that the memory cell 114b has 2,000 electrons left on its floating gate. According to the above equation, the voltage $\Delta V_1$ for the cell 114a will be greater than the voltage $\Delta V_2$ for the cell 114b at the time $t_0$. Therefore, the memory cell 114a (which will erase slower than the memory cell 114b up to the time $t_0$) will not tend to slow down its erase speed as much as the memory cell 114b. In other words, the losing of electrons tends to prevent the floating gate from losing electrons further.

Unfortunately, this self-adjustment on the erase speed mechanism has the drawback of not being strong enough. Otherwise, the number of electrons on the floating gate for each memory cell in the array after a certain amount of erase time would be the same, i.e., the threshold voltage $V_T$ distribution after erase would be ideally a δ function.

In order to enhance the effect of this self-adjustment on the erase speed mechanism, it will be noted that the contribution of the fixed portion (i.e., $V_{SS}$ and $|V_{CG}|$) in the above equation for determining the voltage $\Delta V$ can be reduced. In this manner, when $|Q|$ in a fast-to-erase bit becomes small, the voltage $\Delta V$ will be likewise reduced to a low level which will cause further tunneling to be made difficult. For example, assume at time $t_1$, a fast-to-erase bit has Q=0 on its floating gate. If we let $V_{SS}$= +4 V, $V_{CG}$= –8 V, $\alpha_S$= 0.1 and $\alpha_G$= 0.6, then the voltage $\Delta V$ will be equal to (4×0.9)+ (8×0.6)= 3.6+4.8= 8.4. On the other hand, if the control gate $V_{CG}$ is lowered to $V_{CG}$= –6 V, then the voltage $\Delta V$ will be equal to (4×0.9)+(6×0.6)= 3.6+3.6= 7.2. Accordingly, it will be apparent that it will be much more difficult to further erase the bit from the time $t_1$ with the voltage $\Delta V$ being set equal to 7.2 V rather than 8.4 V. Therefore, a lower control gate bias voltage will not tend to over-erase a bit as will a higher control gate bias voltage and thus result in a better threshold voltage $V_T$ distribution.

Figure 3:
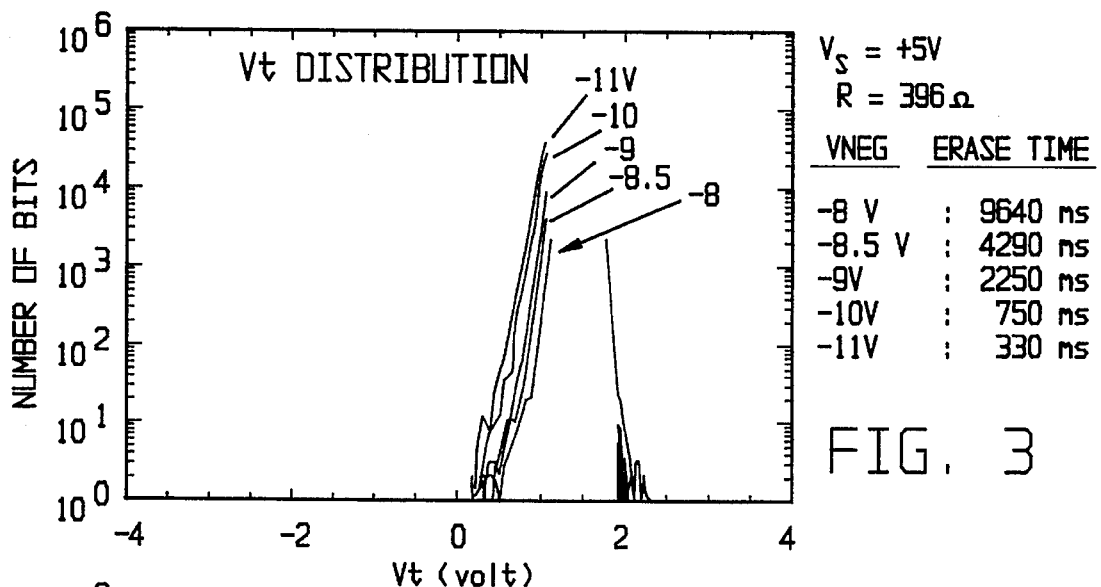
FIG. 3 shows the measured threshold voltage $V_T$ distribution for different control gate voltages $V_{NEG}$ with +5 volts applied to a fixed source resistor.

At the outset, it should be pointed out that the current conventional erase condition for the 5 Volt-Only flash EEPROM device being utilized is the condition of –10.68 volts applied to the control gates and +5.0 volts applied to the source regions via a load (source) resistor R having a value of 396 Ω (–10.78 V/+5.0 V/ 396 Ω). By experimentation, it was found that in the 5 Volt-Only EEPROM device the threshold voltage $V_T$ distribution after erase could be improved by lowering the magnitude of the negative constant bias voltage $|V_{NEG}|$ at the control gate. This result is shown in FIG. 3. The measured threshold voltage $V_T$ distribution for different control gate voltages $V_{NEG}$ is plotted with +5.0 volts applied to the source region by a fixed load resistor (396 Ω). As can be seen, the lowering of the magnitude of the negative constant bias voltage on the control gate renders a tighter $V_T$ distribution. However, as the voltage $V_{NEG}$ was lowered in magnitude from –11 V to –8 V the erase time was increased from approximately 330 ms to 9,640 ms.

Figure 4:
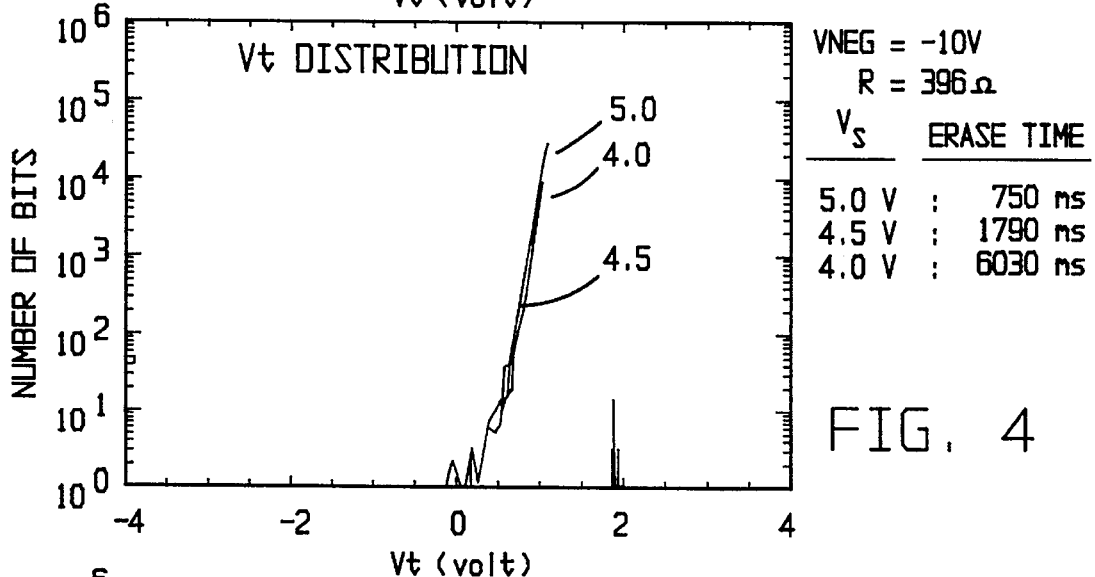
FIG. 4 shows the measured threshold voltage $V_T$ distribution for different source voltages $V_S$ applied to a fixed source resistor with −10 V applied to the control gates.
Figure 5:
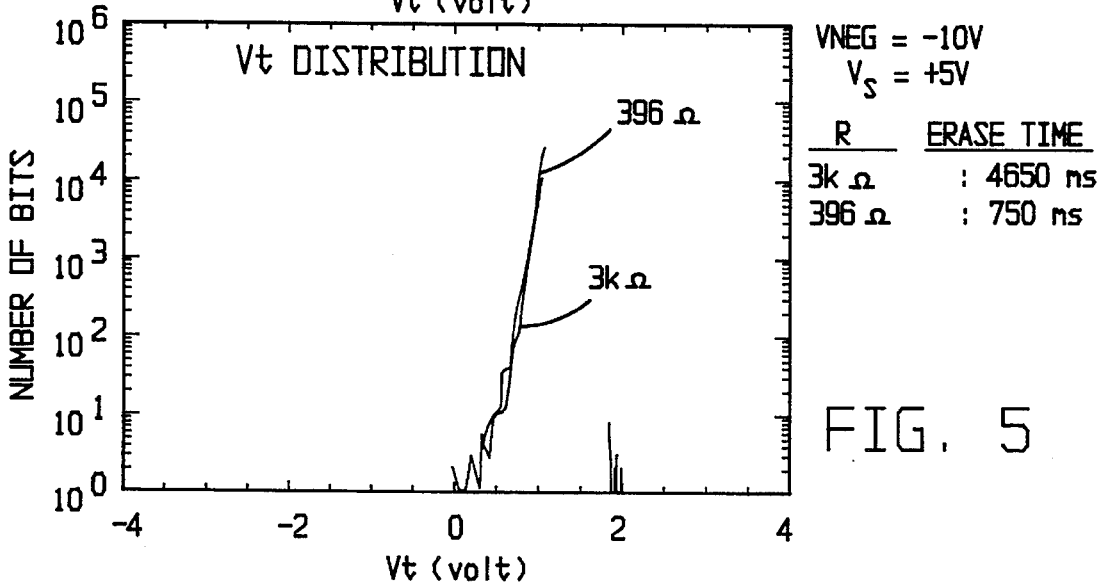
FIG. 5 shows the measured threshold voltage $V_T$ distribution with different values of source resistors with a fixed source voltage and a fixed control gate voltage.

In FIG. 4, the measured threshold voltage $V_T$ distribution for different source voltages $V_S$ applied to a fixed source resistor (396 Ω) is plotted with –10 V applied to the control gates. As the source voltage is changed from +5.0 V to +4.5 V, it was observed that this had little effect on tightening the threshold voltage $V_T$ distribution. However, as the source voltage was decreased from +5.0 V to +4.0 V, the erase time was increased from approximately 750 ms to 6,030 ms. In FIG. 5, the measured threshold voltage $V_T$ distribution for different values of a source resistor with a fixed source voltage $V_S$ (+5 V) is plotted with a fixed control gate voltage (–10 V). Again it was observed that this likewise had substantially no effect in tightening the control voltage $V_T$ distribution. However, as the source resistance was decreased from 3K to 396 Ω, the erase time was reduced from 4,650 ms to 750 ms.

Figure 6:
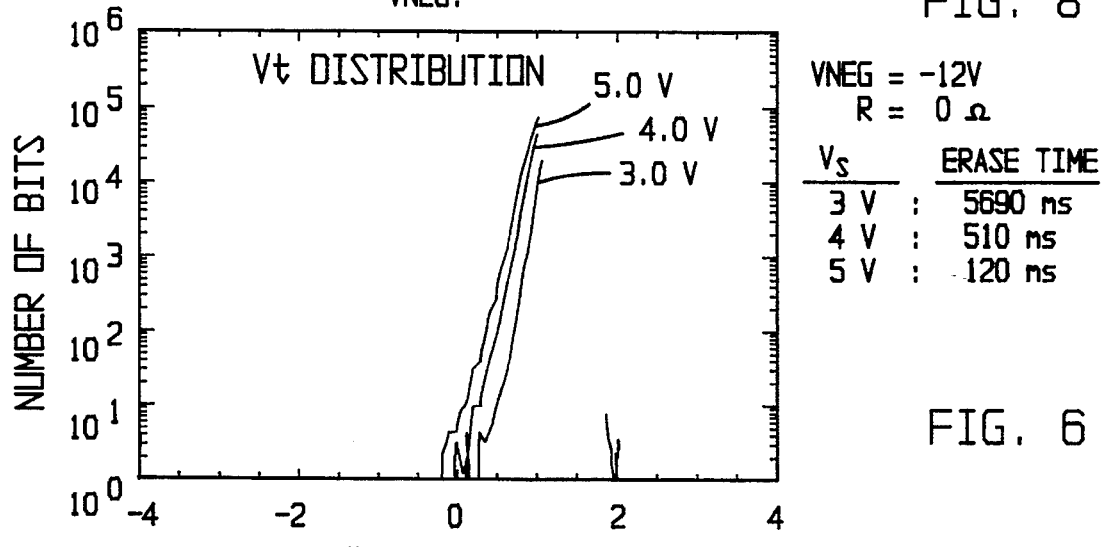
FIG. 6 shows the measured threshold voltage $V_T$ distribution for different source voltages $V_S$ applied directly to the source regions (source resistor is zero) with −12 V applied to the control gate.

In other words, FIGS. 4 and 5 actually indicate that the effect of lowering the source voltage on the threshold voltage $V_T$ distribution is dramatically off-set by the voltage drop across the load resistor. It was also found that the threshold voltage $V_T$ distribution can be improved by lowering the source voltage when it is applied directly to the source regions (i.e., source resistor equal to zero) with –12 V applied to the control gates. This result is depicted in FIG. 6. However, the erase time was increased from approximately 120 ms to 5,690 ms.

In view of performing the various measurements, the inventor has discovered that the problem of wide threshold voltage $V_T$ distribution after erase can be tightened significantly by reconstructing the current erase bias condition. This is accomplished by lowering the magnitude of the negative constant bias voltage $|V_{NEG}|$ applied to the control gate and lowering subsequently the value of the source resistor in order to compensate for the increased erase time caused by the lowered negative bias voltage. As a consequence, there can be achieved by the improved method of the present invention a better threshold voltage $V_T$ distribution after erase without sacrificing of the normal erase speed.

In order to implement this improved technique of the present invention, all of the control gates (terminal pins 134) of the memory cells 112 are connected by lead line 136 to the output terminal 138 of an automatic memory tester 140. The memory tester 140 is of the type similar to an Analyzer System, Serial No. BTMA 2500, that is commonly available from Heuristic Physics Laboratories, Inc., Milpitas, Calif. 95035. Further, all the source regions (terminal pins 142) of the memory cells are connected via lead line 144 and a variable load (source) resistor R to the output terminal 146 of the memory tester 140. All of the drain regions (terminal pins 148) of the memory cells are allowed to float and the substrates 114 thereof are connected to a ground potential. Understandably, the implementation can be done via design or other types of tester.

Memory tester 140 includes a variable positive power supply VCC for generating a positive voltage on the output terminal pin 146 and a negative variable power supply NEG V2 for generating a negative constant bias voltage on the output terminal pin 138. The variable positive supply VCC and the variable negative supply NEG V2 can be set to different values over the erase time and are operated by a computer under a stored program. In addition, the memory tester may include other related hardware, purposely omitted for the sake of clarity.

The current conventional erase operation of the 5 Volt-Only flash EEPROM array 110 of FIG. 2 will now be explained with attention to curve A in FIG. 7. The curve A illustrates the measured threshold voltage $V_T$ distribution after erase for the current erase bias condition of –10.68 V/+5.0 V/396 Ω in the memory array of FIG. 2. In other words, during the erase operation for one programming/ erase cycle a negative constant voltage of –10.68 V is applied to the control gates 128 via the terminal pins 134, a positive voltage of +5.0 V is applied to the source regions 118 via the terminal pins 142, and the drains 116 connected to the terminal pins 148 are allowed to float. Thus, it will be noted that the erase time is approximately 700 ms.

The reconstructed erase technique of the present invention for the 5 Volt-Only flash EEPROM array 110 of FIG. 2 will now be explained with reference to curve B of FIG. 7. The curve B illustrates the measured voltage threshold $V_T$ distribution after erase utilizing the reconstructed technique of the present invention having an optimized erase bias condition of –9.5 V/+5.0 V/56 Ω. During the erase operation for one cycle in the present method, the negative constant voltage of –9.5 V is applied to the control gates and the drains are also allowed to float. While the positive voltage of +5.0 V is also applied to the source regions, it will be noted that the load (source) resistor R has been decreased to 56 Q in order to compensate for the increased erase time caused by lowering the magnitude of the control gate voltage. Accordingly, the erase time is substantially the same as obtained under the current conventional erase bias condition.

Figure 8:
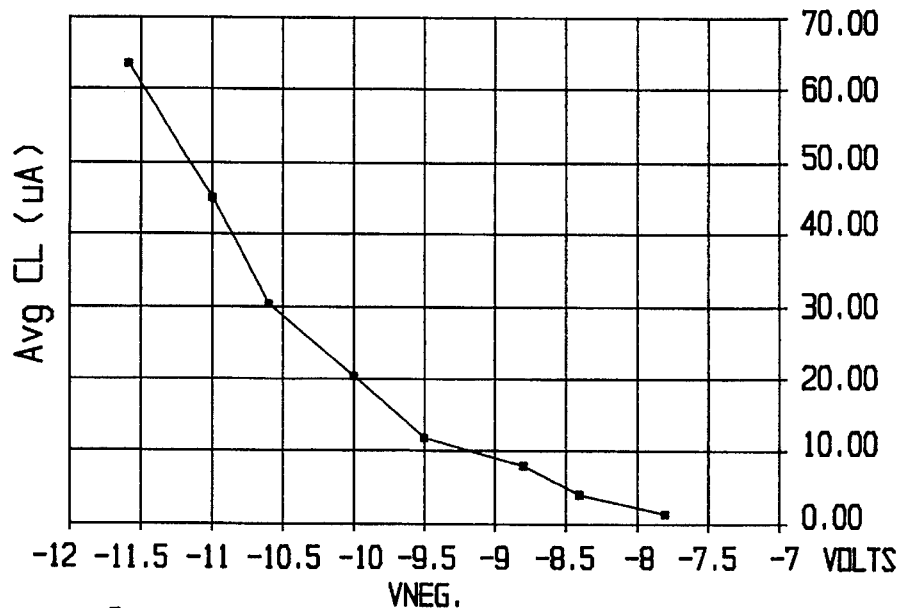
FIG. 8 is a plot of the average column leakage current as a function of the voltage applied to the control gate for a particular product.
Figure 7:
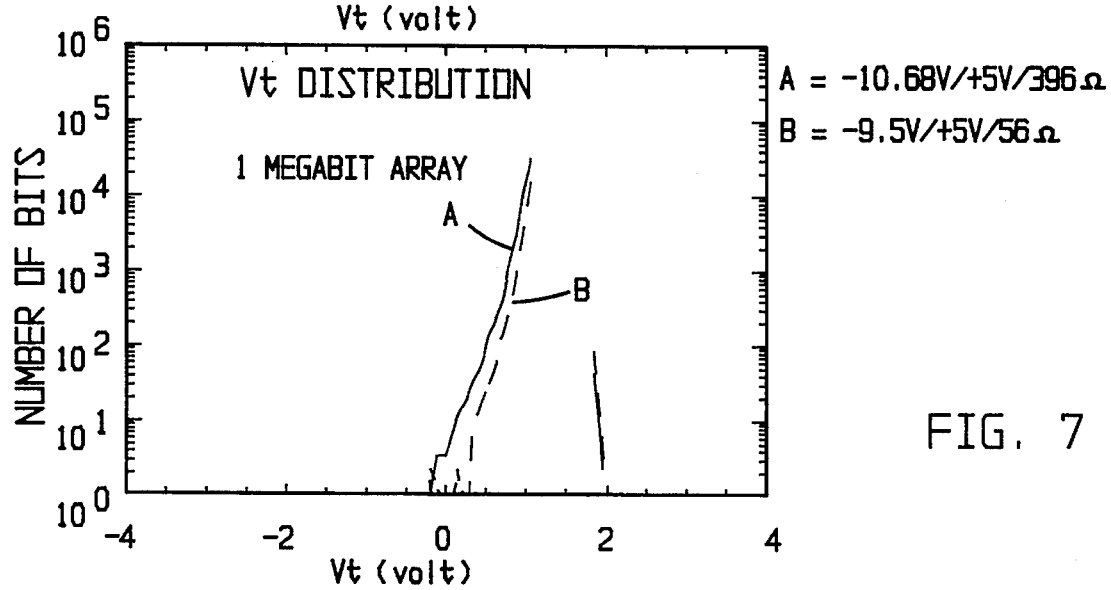
FIG. 7 shows the measured threshold voltage $V_T$ distribution for the current erase bias condition of −10.68 V/+5.0 V/396 Ω and for the optimized erase bias condition of the present invention having −9.5 V/+ 5 V/56 Ω condition.

By comparing curve B with curve A in FIG. 7, it can be seen that the new and improved erase method provides a tighter or narrower distribution of the threshold voltage $V_T$ after erase without reducing the erase speed over the current erase bias condition and thus enhances its performance. The tighter threshold voltage $V_T$ distribution after erase provided by this improved erase technique will render a smaller column leakage after erase. This is illustrated from the product data of FIG. 8. It will be noted that if the column leakage is high in the product, the average column leakage current can be significantly improved by lowering the control gate voltage $V_{NEG}$.

It should be clearly understood that the load resistor value of 56 Ω is used only when the array 112 of FIG. 2 is formed of 1 megabit (cells). For example, if the array size is 512K (0.5 megabit) the corresponding resistor value would be increased to 112 Ω. This is because since the substrate current through the load resistor for a 0.5 megabit array will only be one-half of that of the 1 megabit array. Thus, in order to maintain the same voltage drop across the load resistor, it must be increased doubly in size.

Through experimentation with the interval voltages generated by the memory tester 140 and applied to the control gates, source and drain in the memory array 110 as well as changing of the values of the load resistor, it has been determined that if the magnitude of the negative constant voltage $|V_{NEG}|$ is not lowered below 9.5 V or if the value of the load resistor is not lowered below 56 Ω, the threshold voltage $V_T$ will not be significantly improved. On the other hand, if the $|V_{NEG}|$ is lowered below 9.5 V, then the erase time will be much slower. Further, if the value of the load resistor is reduced below 56 Ω, the peak substrate current will be significantly increased. Accordingly, the optimized erase bias condition of −9.5 V/+5.0 V/56 Ω has been determined in this manner.

From the foregoing detailed description, it can thus be seen that the present invention provides an improved method for tightening the distribution of control-gate threshold voltage of erase cells in flash EEPROM devices. The erase technique of the present invention is achieved by lowering the magnitude of the instant bias voltage applied to the control gates during erasure and reducing simultaneously the value of the load resistor coupled between a positive source voltage $V_S$ and the source regions.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method for tightening the distribution of control gate threshold voltages of erased cells of flash EEPROM devices, said method comprising the steps of:

applying a relatively low positive voltage to source regions of said EEPROM devices during an entire erase cycle;

lowering the magnitude of a negative constant voltage applied to control gates of said EEPROM devices from a predetermined higher voltage level to a predetermined lower voltage level during the entire erase cycle so as to obtain a tighter threshold voltage distribution; and reducing simultaneously the value of a load resistor coupled between the low positive voltage and the source regions from a predetermined higher value to a predetermined lower value so as to compensate for an increased erase time caused by the lowering of the magnitude of the negative constant voltage, whereby an improved threshold voltage $V_T$ distribution after erase is obtained without sacrificing any reduction in the erase speed.

2. A method as claimed in claim 1, wherein said low positive voltage has a magnitude of +5.0 volts.

3. A method as claimed in claim 2, wherein the predetermined lower voltage level of said negative constant voltage is not below the absolute value of 9.5 volts.

4. A method as claimed in claim 3, wherein the predetermined lower value of said load resistor is not below 56 Ω for a 1 megabit array.

5. A method as claimed in claim 2, wherein the predetermined lower voltage level of said negative constant voltage has the absolute value of 9.5 volts.

6. A method as claimed in claim 3, wherein the predetermined lower value of said load resistor is 56 Ω for a 1 megabit array.

* * * * *

UNITED STATES PATENT AND TRADEMARK OFFICE
CERTIFICATE OF CORRECTION

PATENT NO. : 5,481,494
DATED : January 2, 1996
INVENTOR(S) : Yuan Tang et al.

It is certified that error appears in the above-indentified patent and that said Letters Patent is hereby corrected as shown below:

Column 8, line 31, change "the" to --an--.

Signed and Sealed this

Second Day of April, 1996

Attest:

BRUCE LEHMAN

Attesting Officer

Commissioner of Patents and Trademarks